US 7,234,090 B2

(12) United States Patent
Blasi et al.

(10) Patent No.: US 7,234,090 B2
(45) Date of Patent: Jun. 19, 2007

(54) METHOD AND APPARATUS FOR SELECTIVE SCAN CHAIN DIAGNOSTICS

(75) Inventors: Charles J. Blasi, Highland, NY (US); Todd M. Burdine, Wappingers Falls, NY (US); Orazio P. Forlenza, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 263 days.

(21) Appl. No.: 10/932,607

(22) Filed: Sep. 2, 2004

(65) Prior Publication Data

US 2006/0048028 A1   Mar. 2, 2006

(51) Int. Cl.
*G01R 31/28* (2006.01)
*G06F 17/50* (2006.01)

(52) U.S. Cl. .......................................... 714/726; 716/4
(58) Field of Classification Search ................ 714/724, 714/726–729; 716/4
See application file for complete search history.

(56) References Cited

U.S. PATENT DOCUMENTS

| 3,761,695 | A | * | 9/1973 | Eichelberger | ................ | 714/726 |
| 4,503,386 | A | * | 3/1985 | DasGupta et al. | ........... | 714/731 |
| 5,640,402 | A | * | 6/1997 | Motika et al. | ............... | 714/731 |
| 5,657,332 | A | * | 8/1997 | Auclair et al. | ............... | 714/763 |
| 6,278,956 | B1 | * | 8/2001 | Leroux et al. | ............... | 702/117 |
| 6,308,290 | B1 | * | 10/2001 | Forlenza et al. | ............ | 714/724 |
| 6,694,454 | B1 | * | 2/2004 | Stanley | ........................ | 714/30 |
| 7,058,869 | B2 | * | 6/2006 | Abdel-Hafez et al. | ...... | 714/729 |
| 2003/0131294 | A1 | * | 7/2003 | Motika et al. | ............... | 714/718 |
| 2005/0138514 | A1 | * | 6/2005 | Burdine et al. | ............. | 714/733 |
| 2005/0172188 | A1 | * | 8/2005 | Burdine | ....................... | 714/726 |
| 2005/0229057 | A1 | * | 10/2005 | Anderson et al. | ........... | 714/726 |

FOREIGN PATENT DOCUMENTS

JP         62195169 A   *   8/1987
JP         06230075 A   *   8/1994

OTHER PUBLICATIONS

DC Scan Diagnostic Method by Forlenza et al. published in the IP.COM Journal, V4, N3, p. 1-7 (Mar. 2004).*

* cited by examiner

*Primary Examiner*—Cynthia Britt
(74) *Attorney, Agent, or Firm*—Lynn L. Augspurger; Floyd A. Gonzalez

(57) ABSTRACT

A method, apparatus and program product for testing at least one scan chain in an electronic chip in which the scan chain is formed by shift register latches arranged in the chain having a scan path with input pins and output pins. A flush test is executed for the scan chain under test and the flush test diagnostics for the flush test are recorded. A scan test is then executed for the scan chain under test and further test diagnostics are recorded in the event either or both the flush test or the scan test fails. The recorded flush test diagnostics and further test diagnostics are then analyzed to identify a call to one or more probable failed or failing shift register latches in the tested scan chain. The further scan chain diagnostics may include Disturb, Deterministic, ABIST, LBIST and Look-Ahead diagnostics. The tests may also be conducted for different voltage levels to determine the sensitivity of the scan chain being tested to differing voltage levels.

30 Claims, 5 Drawing Sheets

METHOD AND APPARATUS FOR SELECTIVE SCAN CHAIN DIAGNOSTICS

FIELD OF THE INVENTION

The present invention is related to a method and apparatus for testing and diagnosing scan chains in an electronic chip, and is more particularly related to a system and method for using algorithms for diagnosing scan chain failures.

BACKGROUND OF THE INVENTION

A number of different methods currently exist to diagnose scan chain failures in an electronic chip. See, for example, U.S. Pat. No. 3,761,695 issued Sep. 25, 1973 by Eichelberger for METHOD OF LEVEL SENSITIVE TESTING A FUNCTIONAL LOGIC SYSTEM; U.S. Pat. No. 6,308,290 B1 issued Oct. 23, 2001 to Forlenza et al. for LOOK AHEAD SCAN CHAIN DIAGNOSTIC METHOD; U.S. patent application US 2003/0131294 A1 published Jul. 10, 2003 by Motika et al. STUCK-AT FAULT SCAN CHAIN DIAGNOSTIC METHOD; U.S. patent Ser. No. 10/728,348 filed Dec. 4, 2003 by Forlenza et al. for ABIST-ASSISTED DETECTION OF SCAN CHAIN EFFECTS; U.S. patent application Ser. No. 10/767,046 filed Jan. 29, 2004 by Burdine for DIAGNOSTIC METHOD FOR DETECTION OF MULTIPLE DEFECTS IN A LEVEL SENSITIVE SCAN DESIGN (LSSD); U.S. patent application Ser. No. 10/821,160 filed Apr. 8, 2004 by Forlenza et al. for METHOD, APPARATUS, AND COMPUTER PROGRAM PRODUCT FOR IMPLEMENTING DETERMINISTIC BASED BROKEN SCAN CHAIN DIAGNOSTICS; and DC SCAN DIAGNOSTIC METHOD by Forlenza et al. published in the IP. COM Journal, V4, N3, p. 117 (March 2004), all owned by the assignee of the present invention and incorporated herein by reference. Typically, however, no one method by itself is sufficient to diagnose a scan chain fail with enough confidence to send it to Physical Failure Analysis (PFA) where the failure is analyzed to determine the cause of a failure and correct the process for making the chip to prevent the failure in future runs. These methods are self-contained entities, and are not structured to interface with one another. Much time is spent determining which method(s) to utilize and exercising these methods manually. Even if a method is automated via a software medium (i.e. in a computer system), manual intervention is still required to determine which method(s) to use, to capture the results from each method, and to analyze the results from each method to determine which device to send to PFA.

Typically it takes days, and sometimes weeks, to diagnose a sufficient number of failing devices to send to PFA. During these days and weeks, the manufacturing fabrication line (fab) is still producing products which probably contain the same defects. Therefore, yields remain low, which results in significant cost-impacts. Therefore, it is critical that failing parts be diagnosed as quickly as possible to minimize the amount of defective product that continues to be processed through the wafer fab.

BRIEF SUMMARY OF THE INVENTION

The present invention discloses a system and algorithm which utilize the existing scan chain diagnostic methods to selectively and automatically diagnose large amounts of product, and further to analyze the resulting data and select devices to be sent to PFA. There are several advantages to this method over using individual scan chain diagnostic methods. Human error is often part of misdiagnosed parts. Using the automated interface, the probability of user error is reduced to virtually zero. The time required to diagnose parts is significantly reduced. An entire wafer (50–150 devices) can be diagnosed in a single 8 hour shift, whereas it typically takes a week to diagnose 6–12 parts using the methods individually. Since this method is based on automation, there is no requirement for personnel to interact with the test. Finally, this method can be incorporated into existing test programs to perform diagnostics on-the-fly without having to go through post-test analysis.

The invention includes an algorithm which is used to determine the test application protocol and order of execution thereof, and the appropriate scan diagnostic techniques to perform based on prior and combined test results. Further, it includes a method of collecting the results of the scan diagnostics and analysis of the data to determine which devices, to send to PFA.

It is thus an object of the present invention to present a method, apparatus and program product for testing at least one scan chain in an electronic chip in which the scan chain is formed by shift register latches arranged in the chain having a scan path with input pins and output pins.

It is a further object of the present invention to provide a flush test executed for the scan chain under test and wherein the flush test diagnostics for the flush test are recorded.

It is a further object of the present invention wherein a scan test is also executed for the scan chain under test and wherein further test diagnostics are recorded in the event either or both the flush test or the scan test fails.

It is a further object of the present invention wherein the recorded flush test diagnostics and further test diagnostics are then analyzed to identify a call to one or more probable failed or failing shift register latches in the tested scan chain.

It is a further object of the present invention wherein the further scan chain diagnostics may include Disturb, Deterministic, ABIST, LBIST and Look-Ahead diagnostics.

It is also an object of the present invention wherein the tests may be conducted for different voltage levels to determine the sensitivity of the scan chain being tested to differing voltage levels.

BRIEF DESCRIPTION OF THE SEVERAL VIEWS OF THE DRAWING

These and other objects will be apparent to one skilled in the art from the following detailed description of the invention taken in conjunction with the accompanying drawings in which:

FIGS. 5, 6 and 7, when taken together, form a flow diagram of the computer program of the present invention wherein FIG. 5 is a flow diagram of the general purpose test register and shorty flush and scan operations of the present invention, FIG. 6 is the special purpose flush and scan operations and the flush and scan operations for multiple scan chains of the a chip under test, and FIG. 7 is a flow diagram of the analysis of the diagnostics determined in the program flow of FIGS. 5 and 6.

DETAILED DESCRIPTION OF THE INVENTION

Figure 1:
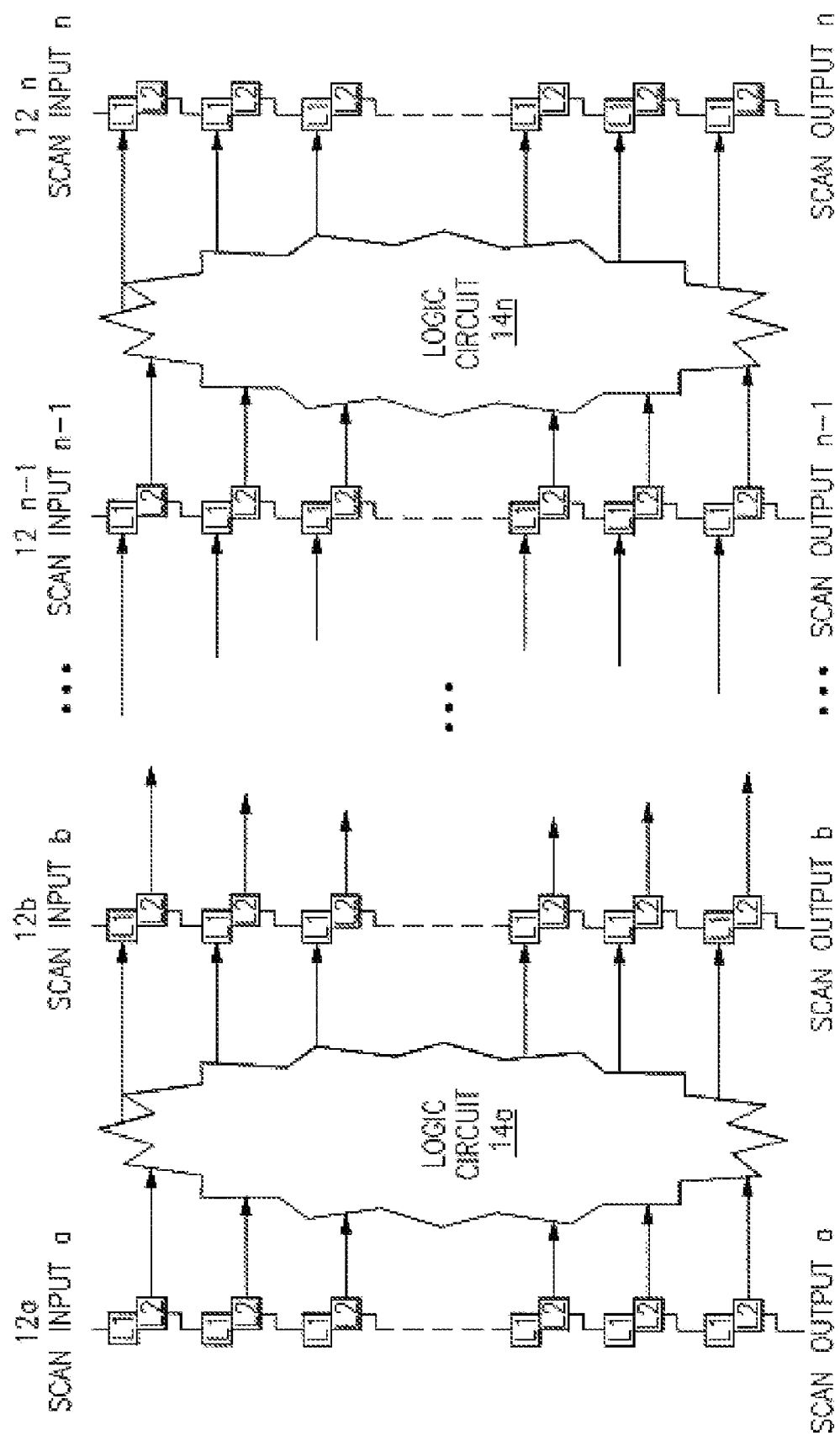
FIG. 1 is a schematic diagram of a chip which may be used with the present invention.

FIG. 1 is a schematic diagram of an example chip 10 which may be diagnosed with the present invention. The chip 10 is designed in a Level Sensitive Scan Design (LSSD), which includes scan chains 12a–12n which provide access to internal logic circuits 14a–14n in the chip 10. The scan chains 12 can be configured as one long chain or multiple short chains. As is known, data may be entered into a scan chain 12 at the input of the chain (WRPIN), and the data may be read at the output (WRPOUT) of the chain 12 to test the integrity of the chain, and to detect errors.

Figure 2:
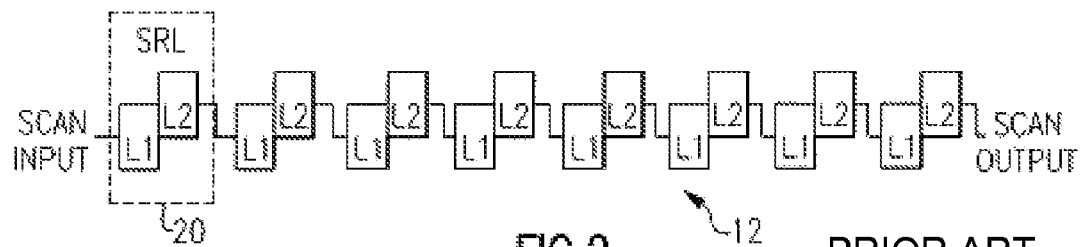
FIG. 2 is a schematic diagram of a scan chain of the chip of FIG. 1.
Figure 3:
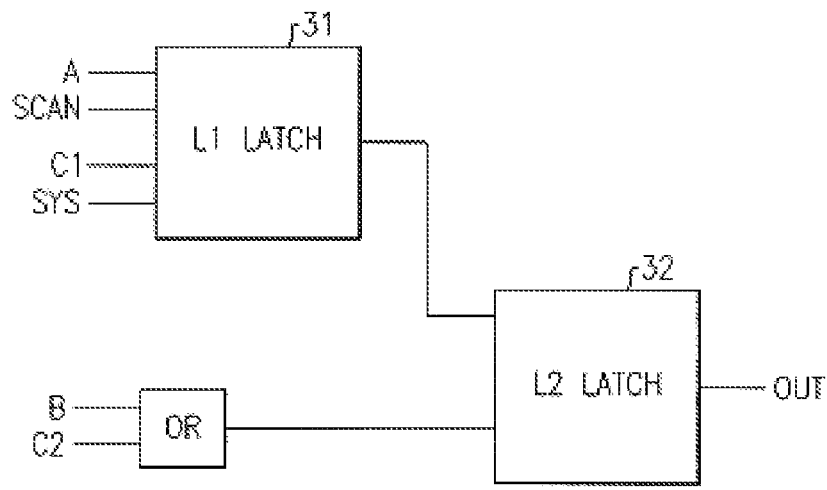
FIG. 3 is a schematic diagram of a shift register latch of the scan chain of FIG. 2.

FIG. 2 is a schematic diagram of a scan chain 12 and is composed on a number of L1/L2 shift register latch (SRL) pairs 20. As shown in FIG. 3, each SRL pair 20 consists of an L1 latch 31 connected to an L2 latch 32. When the A clock input of the L1 latch 31 is pulsed, the data at the SCAN port is captured and stored in the latch 31. Similarly, when the B or C2 clock inputs of the L2 latch is pulsed, the data from the output of the corresponding L1 latch 31 is captured and stored in the L2 latch 32. When the C1 clock input of the L1 latch 31 is pulsed, the data on the SYS port of the latch 31 is captured.

Figure 4:
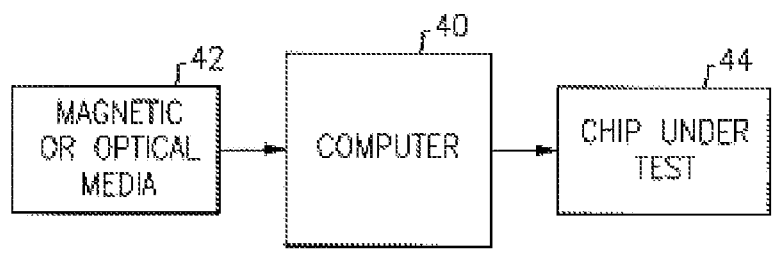
FIG. 4 is a block diagram of a system for testing the chip of FIG. 1 with a computer programed with a computer program of the present invention.

Since the scan chain 20 provides access to the internal logic circuits 14 of a chip 10, its function is critical in testing the chip. Scan chain fallout is often a problem early in a product's life-cycle, and quickly diagnosing scan fails is vital. FIG. 4 is a block diagram of the system used in the testing of a chip. The test is typically carried out by a computer 40 executing an algorithm loaded into the computer 40 as computer readable programmable code recorded on magnetic or optical media 42. The computer 40 then executes the programmable computer code from the media 42 to test a connected chip under test 44 to detect scan chain fails.

Scan chain fails can be divided into two categories: DC defects and broken. A scan chain with a DC defect will only operate under certain conditions (i.e. only between 1.2V and 1.3V). A broken scan chain is one that will not operate under any conditions (i.e. voltage, frequency, temperature, scan rate).

Figure 5:
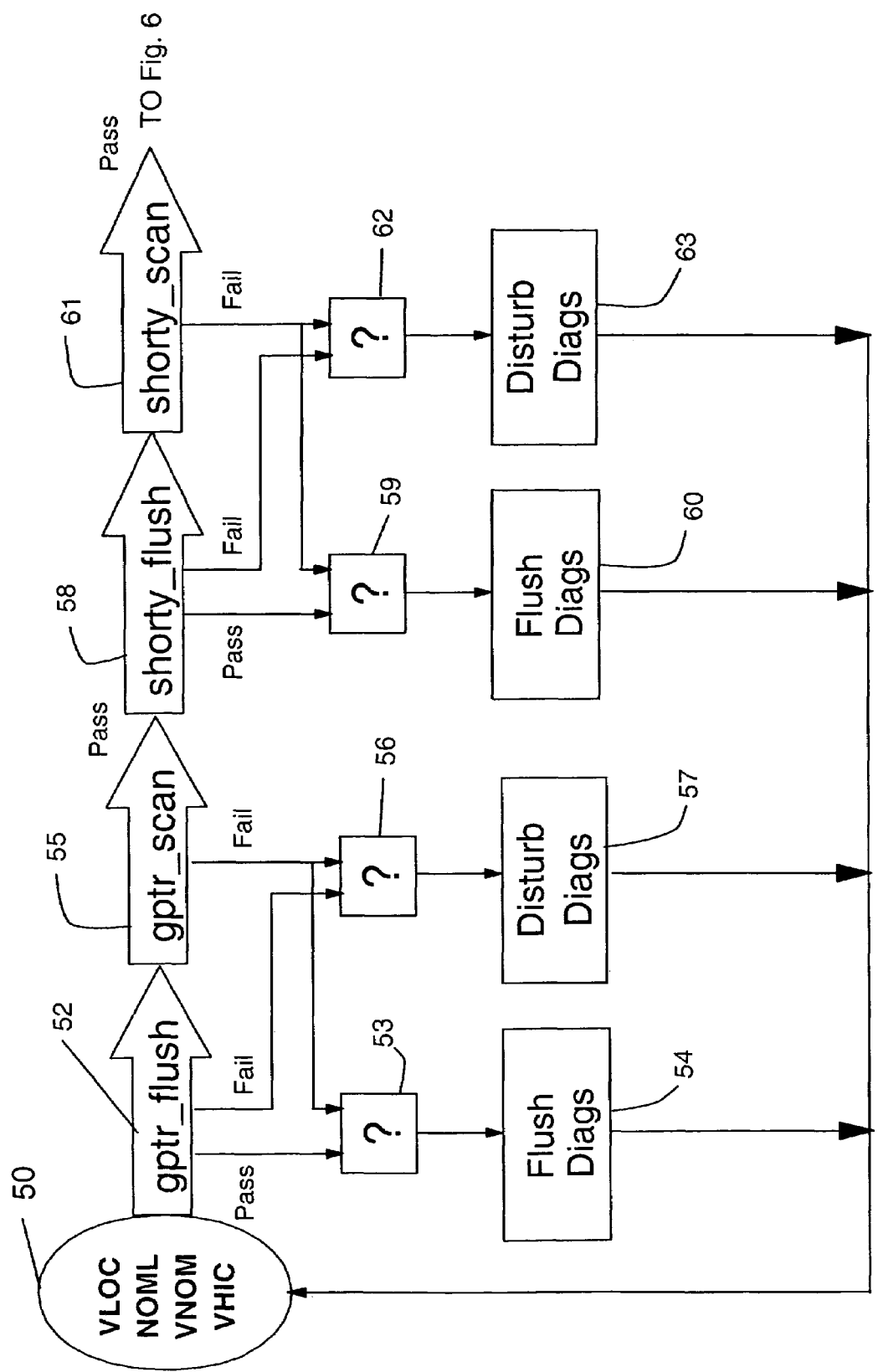
Figure 6:
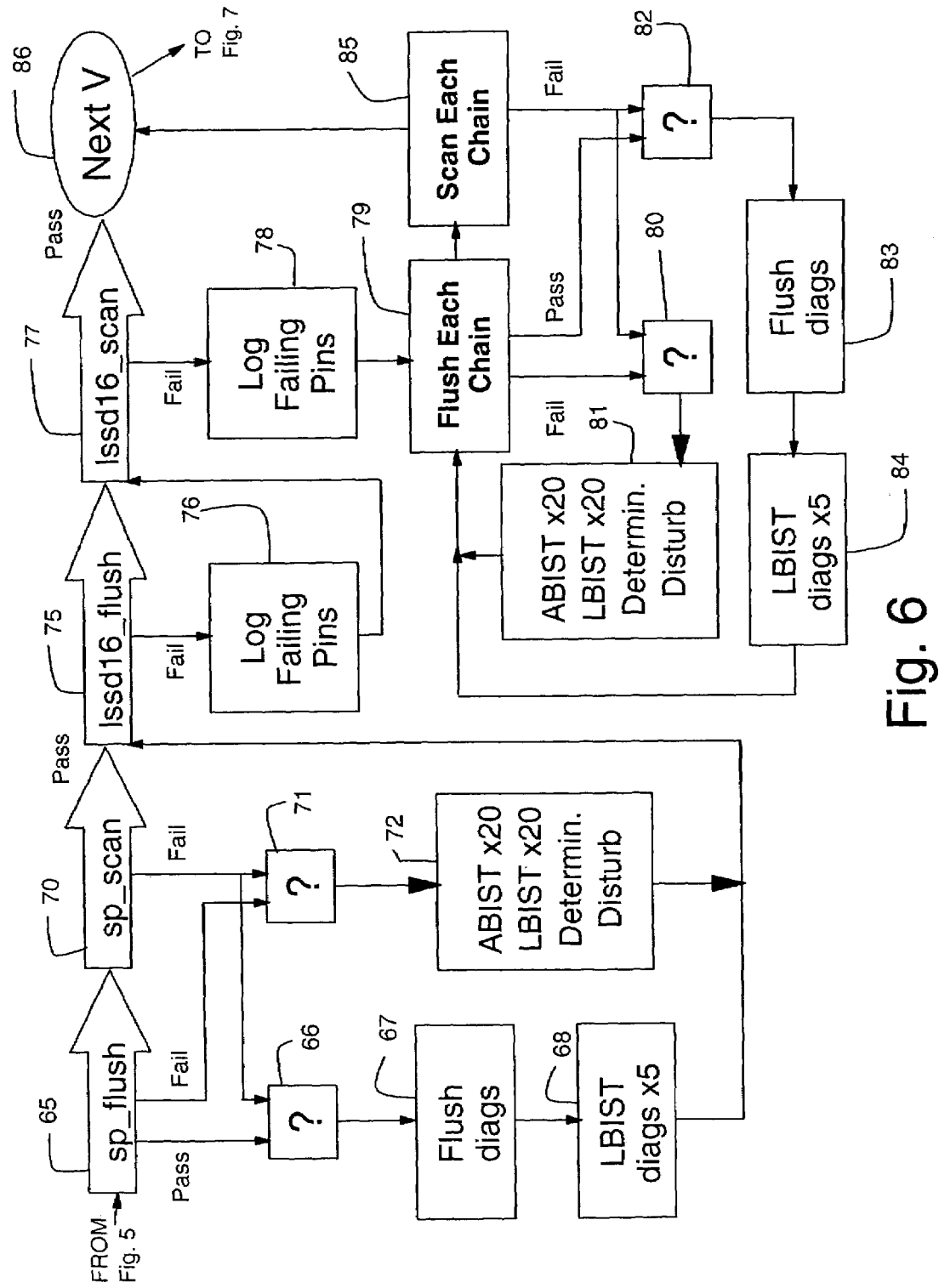
Figure 7:
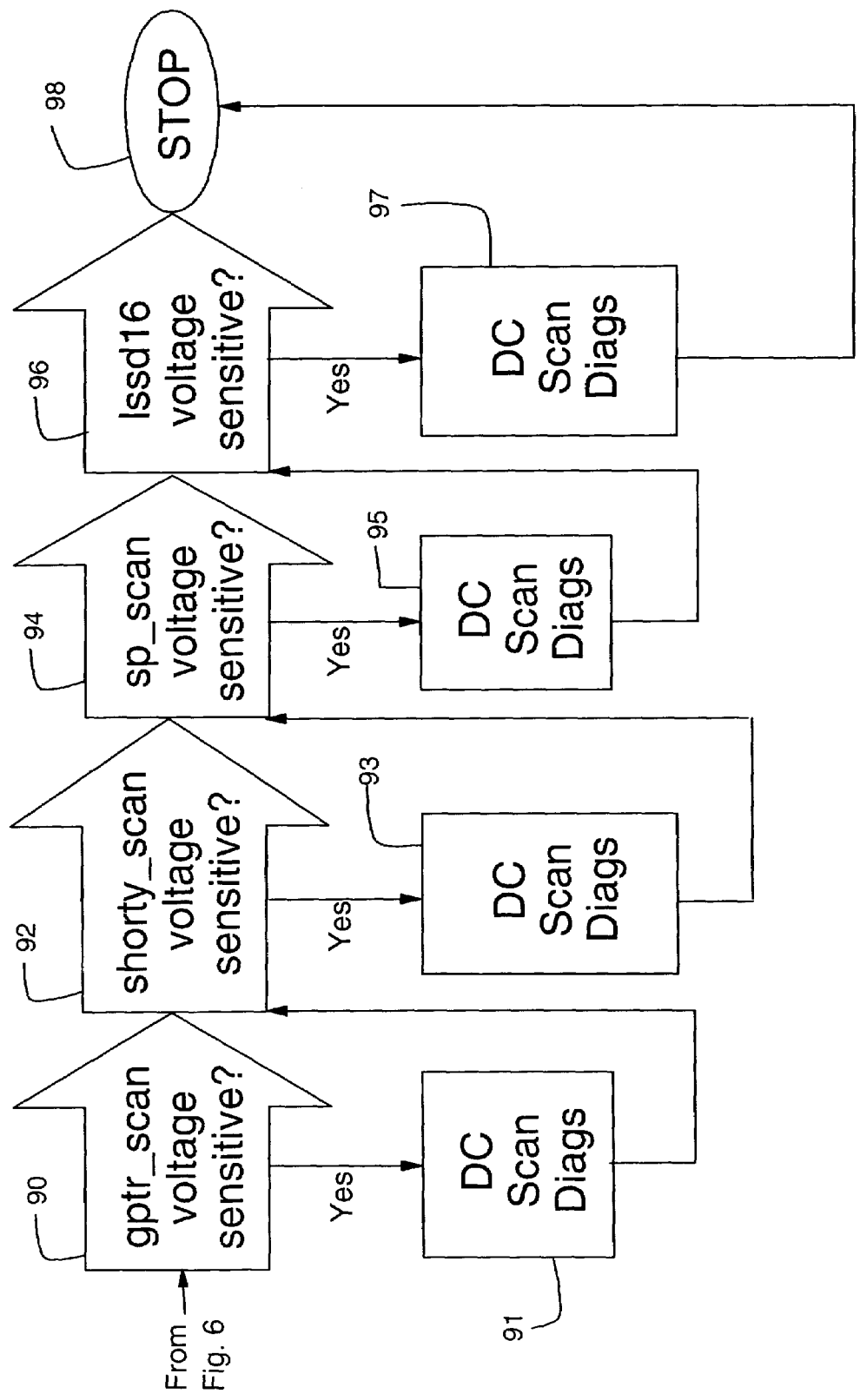

FIGS. 5, 6 and 7, taken together, form a flowchart of an algorithm of the invention which can be implemented via a computer program 42 of FIG. 4 to automatically and selectively perform scan diagnostics on-the-fly on a large volume of failing devices 44. The method utilizes scan chain diagnostic methods, as well as the standard test patterns which are generated for all products tested. This is accomplished with very low wafer final test (WFT) overhead.

At a high level, Selective Scan Chain Diagnostics is performed in the following steps:

Execute the normal flush and scan test patterns (for all test modes) at multiple voltage corners (i.e. 1.0V, 1.15V, 1.3V, 1.5V corresponding to a device's Low, Nominal Low, Nominal High, and High Conductance Voltage Corner engineering specifications).

For each mode, or pair of flush and scan tests:

If both the flush and scan tests fail, perform Broken scan chain diagnostics, including ABIST (discussed in the aforementioned patent application Ser. No. 10/821, 160), LBIST (discussed in the Forlenza et al. IP.COM publication), Deterministic (discussed in the aforementioned patent application Ser. No. 10/821,160), disturb (discussed in the aforementioned U.S. patent application US 2003/0131294 A1), and Look-Ahead (discussed in the aforementioned U.S. Pat. No. 6,308,290) scan chain diagnostics.

If the flush test passes and the scan test fails, perform well known Flush scan chain diagnostics as well as Broken scan chain diagnostics.

If the scan test is DC sensitive (i.e. passes under some conditions), perform DC scan chain diagnostics (discussed in the aforementioned U.S. patent Ser. No. 10/767,046) as well as Broken scan chain diagnostics.

If the scan test passes, do not perform any diagnostics.

For multiple chain configurations (i.e. lssd16 test mode), perform the tests on each individual scan chain, and perform scan chain diagnostics based on the previous criteria.

Analyze results from all diagnostic methods performed and assign a hit probability based on the following criteria:

Compare results from different scan chain configurations which contain the same suspect latch (i.e. sp_wafer test mode vs. LSSD16 test mode)

Matching results improve confidence

Compare results from the different scan chain diagnostic methods

Matching or close results improve confidence

Large variations in latch calls reduces confidence

Compare results from all devices to look for common mode fails

A common mode fail increases confidence

FIGS. 5, 6 and 7 are flow charts which show the steps for IBM eServer xSeries 900 parts. Similar charts can be generated for later devices which do not have flush capability, and ASIC devices which may not have ABIST/LBIST capability. The steps marked "NEXT" in FIG. 6 signify that further diagnostics cannot be performed at that voltage corner, and that the next voltage corner should be tested.

Returning to FIGS. 5 and 6, the program is started at 50 of FIG. 5 wherein a scan chain is repeated tested for dc faults at different voltage levels. For instance, the chain may be tested at the devices Voltage Low Corner (VLOC) 1.0 V, Nominal Low (NOML) 1.15V, Voltage Nominal High (VNOM) 1.3V, and Voltage High Conductance (VHIC) 1.5V voltage corners. It will be understood that other voltage values and voltage corners may be chosen in addition to or in the alternative, as desired.

In a flush operation, both of the clocks of the SRL pairs of a chain are held high, and the outputs of the chain are tested to see if outputted data for the chain or portion of a chain is the same as the inputted data. In a scan test, values are clocked into C1 of the first SRL latch, and the value is walked down the chain to detect any errors.

FIG. 5 is a flow chart which illustrates testing operations of the general purpose test registers of a chip under test. At 52, a general purpose test register flush (gptr_flush) operation is conducted. If the gptr_flush operation at 52 is passed, a test is conducted at 53 and flush diagnostics are determined at 54, and the next voltage level at 50 is conducted. After the gptr_flush operation at 52, a gptr_scan operation is conducted at 55. If gptr_scan at 55 fails, a test is conducted at 56, and disturb diagnostics are determined at 57. Also, if the gptr_flush operation at 52 fails the test at 56 is conducted and the disturb diagnostics are determined at 57. If gptr_scan fails, the test at 53 is conducted and the flush diagnostics are also determined at 54. The program then goes back to 50 for the next voltage corner. If the gptr_scan operation at 55 passes, the general purpose test registers are tested in a series of short pieces (shorty tests) as discussed in the aforementioned U.S. Pat. No. 3,761,695. If each of the shorty_flush operations at 58 pass, tests at 59 are conducted and the flush diagnostics are determined at 60, and the next voltage corner at 50 is tested. After the shorty_flush operations at 58, shorty_scan operations are conducted at 61. If the shorty_flush operations at 58 or the shorty_scan operations at 61 fail, at test is made at 62, the disturbance diagnostics are determined at 63, and the next voltage corner at 50 is tested. Also, if shorty_scan fails, the test is conducted at 59 and the flush diagnostics are determined at 60.

If all of the shorty_scan operations of the general purpose test registers pass at 61, the program goes to FIG. 6. FIG. 6 is a flow chart showing the operations for testing the special purpose register scan chains of the chip under test. At 65, a special purpose flush (sp_flush) operation is conducted for a scan chain being tested. If the sp_flush at 65 passes a test is made at 66 and the flush diagnostics are determined at 67. A set of five diagnostics for the LBIST is determined at 68, and the program goes to the lssd16_flush operation 75, to be discussed. After the sp_flush operation at 65, an sp_scan operation 70 is performed. If the sp_flush operation at 65 fails or the sp_scan operation at 70 fails, a test is made at 71 and the program determines ABIST (discussed in the aforementioned patent application Ser. No. (10/821,160), LBIST (discussed in the Forlenza et al. IP.COM publication), Deterministic (discussed in the aforementioned patent application Ser. No. 10/821,160), and disturb (discussed in the aforementioned U.S. patent application US 2003/0131294 A1) diagnostics at 72. The determination of diagnostics at 72 may include Look-Ahead diagnostics (discussed in the aforementioned U.S. Pat. No. 6,308,290). Also, if the sp_scan operation at 70 fails, the test at 66 is made and the flush diagnostics 67 and the LBIST diagnostics at 68 are determined.

If multiple scan chains are to be tested, the program goes to the level sensitive scan design 16 (lssd16) test operations starting at 75. If any of the multiple scan chains fail the lssd16_flush test at 75, the failing pins are logged at 76, and the program goes to the lssd16_scan test at 77 where all of the multiple scan chains are given a scan test. If any of the multiple scan chains fail at 77, the failing pins are logged at 78. The test at 75 includes flushing each chain at 79. If a chain fails at 79, a test is made at 80, and ABIST, LBIST Deterministic, Disturb and Look-Ahead diagnostics are determined for the failed chain at 81. The program then returns to 79 to flush the next chain, until all of the chains have been flushed. If the flush of a scan chain at 70 passes, a test is conducted at 82 and the flush diagnostics and LBIST diagnostics are determined at 83 and 84. After all of the scan chains are flushed at 79, each scan chain is scanned at 85. If a scan chain fails the scan at 85, the failing chain is tested at 80 and 81 wherein diagnostics are determined, as discussed. After all of the scan chains are scanned at 85, the program goes to 86 to perform the next test operation for the next voltage level as discussed at 50 of FIG. 5.

After the program flow of FIGS. 5 and 6, the program goes to FIG. 7 to analyze the determined diagnostics. At 90 the gptr_scan results are reviewed to determine if the general purpose test registers are voltage sensitive. I yes, the DC scan diagnostics are analyzed at 91. At 92, the shorty_scan results are reviewed to determine if the shorty_scan tests are voltage sensitive. If yes, the DC scan diagnostics are analyzed at 93. At 94, the sp_scan results are reviewed to determine if the special purpose registers are voltage sensitive. If yes, the DC scan diagnostics are analyzed at 95. Finally, at 96, the lssd16 results are reviewed to determine if any of the multiple scan chains are voltage sensitive. If they are, the DC scan diagnostics for the multiple scan chains are analyzed at 97. The program then stops at 98. As previously mentioned, if the results from the different scan chain diagnostic methods give matching or close results, confidence is improved and calls to failed or failing scan chain latches are given to PFA for corrective action. This may include pealing back the layers of the chip under test to find the reason why the identified latches have failed or are failing, and correcting the process for fabricating the chip to correct the problem. The program flow of FIG. 7 gives a comparison for all devices being tested to look for common mode fails. Determination of common mode fails of devices being tested increases confidence that the resulting calls to failed or failing latches in the scan chain have been correctly identified.

Table 1 is a program listing of a test program used to diagnose IBM eServer xSeries 900 wafers and modules, which follows a similar structure as the flow charts in FIGS. 5, 6 and 7.

TABLE 1

```
void AutoScan( )
{
    string gptr_flush = "gptr_flush_d0000101.lpa";
    string gptr_scan = "gptr_scan_d0000101.lpa";
    string shorty_flush = "shorty_flush_d0100101.lpa";
    string shorty_scan = "shorty_scan_d0100101.lpa";
    string sp_flush = "sp_flush_d0200201.lpa";
    string sp_scan = "sp_scan_d020020m.lpa";
    string lssd_flush = "lssd_16_ag_flush_d370010m.lpa";
    string lssd_scan = "lssd_16_ag_scan_d370010m.lpa";
    string lbist_lssd = "lbdcag_a2g4k_gptr_d310020m.lpa";
    string lbist_sp = "lbdcag_a2g4k_spscan_d310020m.lpa";
    string gptr_flushed = "gptr_scan_dbf_d0000101.lpa";
    string shorty_flushed = "shorty_scan_dbf_d0100101.lpa";
    string sp_flushed = "sp_scan_dbf_d020020m.lpa";
    string lssd_flushed = "lssd_16_ag_scan_dbf_d370010m.lpa";
    ARRAY<DPIN> scaninpins = {WRP00IN, WRP01IN, WRP02IN,
        WRP03IN,
WRP04IN, WRP05IN, WRP06IN, WRP07IN,
        WRP08IN, WRP09IN, WRP10IN,
            WRP11IN,
WRP12IN, WRP13IN, WRP14IN, WRP15IN};
    ARRAY<DPIN> scanoutpins = {WRP00OUT, WRP01OUT,
        WRP02OUT,
WRP03OUT, WRP04OUT, WRP05OUT, WRP06OUT, WRP07OUT,
        WRP08OUT, WRP09OUT,
            WRP10OUT,
WRP11OUT, WRP12OUT, WRP13OUT, WRP14OUT, WRP15OUT};
    ARRAY<int> noml(100);
    ARRAY<int> vnom(100);
    ARRAY<int> vhic(100);
    for (int a=0; a < 100; a++)
    {
      noml[a]=-1;
      vnom[a]=-1;
      vhic[a]=-1;
    }
NOML:
    Set_voltage_case("NOML    ");
    noml[0] = Normal_Test (8000, gptr_flush);
    noml[1] = Normal_Test (8001, gptr_scan);
    if (noml[0]==0 && noml[1]==1) Flush_Single_Chain (9000,
gptr_flushed, 11055,11057,22079,UNIVSI,TSTSO);
    if (noml[0]==1 || noml[1]==1) goto VNOM;
    noml[2] = Normal_Test (8002, shorty_flush);
    noml[3] = Normal_Test (8003, shorty_scan);
    if (noml[2]==0 && noml[3]==1) Flush_Single_Chain (9001,
shorty_flushed,15913,15915,31795,UNIVSI,TSTSO);
    if (noml[2]==1 || noml[3]==1) goto VNOM;
    noml[4] = Normal_Test (8004, sp_flush);
    noml[5] = Normal_Test (8005, sp_scan);
    noml[6] = LSSD_Test (8006, lssd_flush);
    noml[7] = LSSD_Test (8007, lssd_scan);
    if (noml[4]==0 && noml[5]==1)
```

TABLE 1-continued

```
        {
        Flush_Single_Chain (8100,
sp_flushed,197233,197235,394436,UNIVSI,TSTSO);
        LB_Scan(8200, lbist_sp, 5, TSTSO);
        }
        if (noml[4]==1 && noml[5]==1) LB_Scan(8300, lbist_sp,
20,TSTSO);
        if (noml[7]==1)
        {
        for (a=0; a < scaninpins.len( ); a++) noml[20+a] =
Single_Chain_Test(1,lssd_flush,scanoutpins[a]);
        for (a=0; a < scaninpins.len( ); a++) noml[60+a] =
Single_Chain_Test(1,lssd_scan, scanoutpins[a]);
        for (a=0; a < scaninpins.len( ); a++)
            if (noml[20+a]==0 && noml[60+a]==1)
            {
            Flush_Single_Chain
(8400+a,lssd_flushed,16666,16668,47448,scaninpins[a],scanoutpins[a]);
            LB_Scan(8450+a, lbist_lssd, 20, scanoutpins[a]);
            }
        for (a=0; a < scaninpins.len( ); a++)
            if (noml[20+a]==1 && noml[60+a]==1) LB_Scan(8500+a,
lbist_lssd, 20, scanoutpins[a]);
        }
VNOM: { }
        Set_voltage_case("VNOM   ");
        vnom[0] = Normal_Test (8000, gptr_flush);
        vnom[1] = Normal_Test (8001, gptr_scan);
        if (vnom[0]==0 && vnom[1]==1) Flush_Single_chain (9000,
gptr_flushed, 11055,11057,22079,UNIVSI,TSTSO);
        if (vnom[0]==1 || vnom[1]==1) goto VHIC;
        vnom[2] = Normal_Test (8002, shorty_flush);
        vnom[3] = Normal_Test (8003, shorty_scan);
        if (vnom[2]==0 && vnom[3]==1) Flush_Single_Chain (9001,
shorty_flushed,15913,15915,31795,UNIVSI,TSTSO);
        if (vnom[2]==1 || vnom[3]==1) goto VHIC;
        vnom[4] = Normal_Test (8004, sp_flush);
        vnom[5] = Normal_Test (8005, sp_scan);
        vnom[6] = LSSD_Test (8006, lssd_flush);
        vnom[7] = LSSD_Test (8007, lssd_scan);
        if (vnom[4]==0 && vnom[5]==1)
        {
        Flush_Single_Chain (8100,
sp_flushed,197233,197235,394436,UNIVSI,TSTSO);
        LB_Scan(8200, lbist_sp, 5, TSTSO);
        }
        if (vnom[4]==1 && vnom[5]==1) LB_Scan(8300, lbist_sp,
20,TSTSO);
        if (vnom[7]==1)
        {
        for (a=0; a < scaninpins.len( ); a++) vnom[20+a] =
Single_Chain_Test(1,lssd_flush,scanoutpins[a]);
        for (a=0; a < scaninpins.len( ); a++) vnom[60+a] =
Single_Chain_Test(1,lssd_scan,scanoutpins[a]);
        for (a=0; a < scaninpins.len( ); a++)
            if (vnom[20+a]==0 && vnom[60+a]==1)
            {
            Flush_Single_Chain
(8400+a,lssd_flushed,16666,16668,47448,scaninpins[a],scanoutpins[a]);
            LB_Scan(8450+a, lbist_lssd, 20, scanoutpins[a]);
            }
        for (a=0; a < scaninpins.len( ); a++)
            if (vnom[20+a]==1 && vnom[60+a]==1) LB_Scan(8500+a,
lbist_lssd, 20, scanoutpins[a]);
        }
VHIC: { }
        Set_voltage_case("VHIC   ");
        vhic[0] = Normal_Test (8000, gptr_flush);
        vhic[1] = Normal_Test (8001, gptr_scan);
        if (vhic[0]==0 && vhic[1]==1) Flush_Single_Chain (9000,
gptr_flushed, 11055,11057,22079,UNIVSI,TSTSO);
        if (vhic[0]==1 || vhic[1]==1) goto DONE;
        vhic[2] = Normal_Test (8002, shorty_flush);
        vhic[3] = Normal_Test (8003, shorty_scan);
        if (vhic[2]==0 && vhic[3]==1) Flush_Single_Chain (9001,
shorty_flushed,15913,15915,31795,UNIVSI,TSTSO);
        if (vhic[2]==1 || vhic[3]==1) goto DONE;
        vhic[4] = Normal_Test (8004, sp_flush);
        vhic[5] = Normal_Test (8005, sp_scan);
        vhic[6] = LSSD_Test (8006, lssd_flush);
        vhic[7] = LSSD_Test (8007, lssd_scan);
        if (vhic[4]==0 && vhic[5]==1)
        {
        Flush_Single_Chain (8100,
sp_flushed,197233,197235,394436,UNIVSI,TSTSO);
        LB_Scan(8200, lbist_sp, 5, TSTSO);
        }
        if (vhic[4]==1 && vhic[5]==1) LB_Scan(8300, lbist_sp,
20,TSTSO);
        if (vhic[7]==1)
        {
        for (a=0; a < scaninpins.len( ); a++) vhic[20+a] =
Single_Chain_Test(1,lssd_flush,scaninpins[a]);
        for (a=0; a < scaninpins.len( ); a++) vhic[60+a] =
Single_Chain_Test(1,lssd_scan,scanoutpins[a]);
        for (a=0; a < scaninpins.len( ); a++)
            if (vhic[20+a]==0 && vhic[60+a]==1)
            {
            Flush_Single_Chain
(8400+a,lssd_flushed,16666,16668,47448,scaninpins[a],scanoutpins[a]);
            LB_Scan(8450+a, lbist_lssd, 20, scanoutpins[a]);
            }
        for (a=0; a < scaninpins.len( ); a++)
            if (vhic[20+a]==1 && vhic[60+a]==1) LB_Scan(8500+a,
lbist_lssd, 20, scanoutpins[a]);
        }
DONE: { }
        if (noml[1]==0 && vnom[1]==1) DC_Scan (8600, gptr_scan,
1.15V, 1.30V, UNIVSI, TSTSO);
        else if (noml[1]==0 && vhic[1]==1) DC_Scan (8600, gptr_scan,
1.15V, 1.54V, UNIVSI, TSTSO);
        else if (vnom[1]==0 && vhic[1]==1) DC_Scan (8600, gptr_scan,
1.30V, 1.54V, UNIVSI, TSTSO);
        else if (vhic[1]==0 && vnom[1]==1) DC_Scan (8600, gptr_scan,
1.54V, 1.30V, UNIVSI, TSTSO);
        else if (vhic[1]==0 && noml[1]==1) DC_Scan (8600, gptr_scan,
1.54V, 1.15V, UNIVSI, TSTSO);
        else if (vnom[1]==0 && noml[1]==1) DC_Scan (8600, gptr_scan,
1.30V, 1.15V, UNIVSI, TSTSO);
        if (noml[3]==0 && vnom[3]==1) DC_Scan (8700, shorty_scan,
1.15V, 1.30V, UNIVSI, TSTSO);
        else if (noml[3]==0 && vhic[3]==1) DC_Scan (8700,
shorty_scan, 1.15V, 1.54V, UNIVSI, TSTSO);
        else if (vnom[3]==0 && vhic[3]==1) DC_Scan (8700,
shorty_scan, 1.30V, 1.54V, UNIVSI, TSTSO);
        else if (vhic[3]==0 && vnom[3]==1) DC_Scan (8700,
shorty_scan, 1.54V, 1.30V, UNIVSI, TSTSO);
        else if (vhic[3]==0 && noml[3]==1) DC_Scan (8700,
shorty_scan, 1.54V, 1.15V, UNIVSI, TSTSO);
        else if (vnom[3]==0 && noml[3]==1) DC_Scan (8700,
shorty_scan, 1.30V, 1.15V, UNIVSI, TSTSO);
        if (noml[5]==0 && vnom[5]==1) DC_Scan (8800, sp_scan, 1.15V,
1.30V, UNIVSI, TSTSO);
        else if (noml[5]==0 && vhic[5]==1) DC_Scan (8800, sp_scan,
1.15V, 1.54V, UNIVSI, TSTSO);
        else if (vnom[5]==0 && vhic[5]==1) DC_Scan (8800, sp_scan,
1.30V, 1.54V, UNIVSI, TSTSO);
        else if (vhic[5]==0 && vnom[5]==1) DC_Scan (8800, sp_scan,
1.54V, 1.30V, UNIVSI, TSTSO);
        else if (vhic[5]==0 && noml[5]==1) DC_Scan (8800, sp_scan,
1.54V, 1.15V, UNIVSI, TSTSO);
        else if (vnom[5]==0 && noml[5]==1) DC_Scan (8800, sp_scan,
1.30V, 1.15V, UNIVSI, TSTSO);
        for (a=0; a < scaninpins.len( ); a++)
        {
            if (noml[60+a]==0 && vnom[60+a]==1) DC_Scan (8900+a,
lssd_scan, 1.15V, 1.30V, scaninpins[a], scanoutpins[a]);
            else if (noml[60+a]==0 && vhic[60+a]==1) DC_Scan (8900+a,
lssd_scan, 1.15V, 1.54V, scaninpins[a], scanoutpins[a]);
            else if (vnom[60+a]==0 && vhic[60+a]==1) DC_Scan (8900+a,
lssd_scan, 1.30V, 1.54V, scaninpins[a], scanoutpins[a]);
            else if (vhic[60+a]==0 && vnom[60+a]==1) DC_Scan (8900+a,
lssd_scan, 1.54V, 1.30V, scaninpins[a], scanoutpins[a]);
            else if (vhic[60+a]==0 && noml[60+a]==1) DC_Scan (8900+a,
lssd_scan, 1.54V, 1.15V, scaninpins[a], scanoutpins[a]);
```

TABLE 1-continued

```
      else if (vnom[60+a]==0 && noml[60+a]==1) DC_Scan (8900+a,
lssd_scan, 1.30V, 1.15V, scaninpins[a], scanoutpins[a]);
    }
}
```

It should be noted that even though this discussion is utilizing the specific scan diagnostic methods referenced, any other scan diagnostic methods could also be incorporated into this concept.

This invention gives the ability to selectively and automatically perform scan chain diagnostics based upon on-the-fly test results, and further to analyze the diagnostic results to generate failing latch calls and a confidence rating for each call.

This method could also be utilized in Wafer Final Test to diagnose scan fails during a normal manufacturing screen.

While the preferred embodiment of the invention has been illustrated and described herein, it is to be understood that the invention is not limited to the precise construction herein disclosed, and the right is reserved to all changes and modifications coming within the scope of the invention as defined in the appended claims.

What is claimed is:

1. A method for testing at least one failed scan chain in an electronic chip, said failed scan chain formed by shift register latches arranged in the chain having a scan path with input pins and output pins, said failed scan chain having failed at least one previously run test, the method comprising:
    executing a flush test for the scan chain under test;
    recording flush test diagnostics for the flush test;
    executing a scan test for the scan chain under test;
    recording further test diagnostics in the event either or both the flush test or the scan test fails; and
    analyzing the recorded flush test diagnostics and further test diagnostics to identify a call to one or more probable failed or failing shift register latches in the tested scan chain.

2. The method of claim 1 wherein said recording further test diagnostics comprises recording disturb diagnostics for the scan chain under test.

3. The method of claim 1 wherein said recording further test diagnostics comprises recording deterministic diagnostics for the scan chain under test.

4. The method of claim 1 wherein said recording further test diagnostics comprises recording LBIST diagnostics for the scan chain under test.

5. The method of claim 1 wherein said recording further test diagnostics comprises recording ABIST diagnostics for the scan chain under test.

6. The method of claim 1 wherein said recording further test diagnostics comprises recording Look-Ahead diagnostics for the scan chain under test.

7. The method of claim 1 wherein the scan chain being tested comprises a scan chain of general purpose test registers.

8. The method of claim 1 further comprising sequentially testing portions of said scan chain;
    recording flush diagnostics and further diagnostics for each of said sequentially tested portion; and
    analyzing the diagnostics of said portions of said scan chain to further identify a call to failed or failing register latches in the tested scan chain.

9. The method of claim 1 further comprising testing said scan chain at different voltage levels to determine the sensitivity of said tested scan chain to differing voltage levels.

10. The method of claim 1 wherein the electronic chip has multiple scan chains, said method further comprising testing each of said multiple scan chain and logging the pins of failed or failing ones of said scan chains to identify calls to failed or failing register latches in the multiple scan chains being tested.

11. An apparatus for testing at least one failed scan chain in an electronic chip, said failed scan chain formed by shift register latches arranged in the chain having a scan path with input pins and output pins, said failed scan chain having failed at least one previously run test, the apparatus comprising:
    a computer for testing said electronic chip;
    said computer having therein computer executable program code for executing a method comprising:
    executing a flush test for the scan chain under test;
    recording flush test diagnostics for the flush test;
    executing a scan test for the scan chain under test;
    recording further test diagnostics in the event either or both the flush test or the scan test fails; and
    analyzing the recorded flush test diagnostics and further test diagnostics to identify a call to one or more probable failed or failing shift register latches in the tested scan chain.

12. The apparatus of claim 11 wherein said recording further test diagnostics of said method further comprises recording disturb diagnostics for the scan chain under test.

13. The apparatus of claim 11 wherein said recording further test diagnostics of said method further comprises recording deterministic diagnostics for the scan chain under test.

14. The apparatus of claim 11 wherein said recording further test diagnostics of said method further comprises recording LBIST diagnostics for the scan chain under test.

15. The apparatus of claim 11 wherein said recording further test diagnostics of said method further comprises recording ABIST diagnostics for the scan chain under test.

16. The apparatus of claim 11 wherein said recording further test diagnostics of said method further comprises recording Look-Ahead diagnostics for the scan chain under test.

17. The apparatus of claim 11 wherein the scan chain being tested comprises a scan chain of general purpose test registers.

18. The apparatus of claim 11 wherein the method further comprises sequentially testing portions of said scan chain;
    recording flush diagnostics and further diagnostics for each of said sequentially tested portion; and
    analyzing the diagnostics of said portions of said scan chain to further identify a call to failed or failing register latches in the tested scan chain.

19. The apparatus of claim 11 wherein said method further comprises testing said scan chain at different voltage levels to determine the sensitivity of said tested scan chain to differing voltage levels.

20. The apparatus of claim 11 wherein the electronic chip has multiple scan chains, and said method further comprises testing each of said multiple scan chains, and logging the pins of failed or failing ones of said scan chains to identify calls to failed or failing register latches in the multiple scan chains being tested.

21. A program product for testing at least one failed scan chain in an electronic chip, said failed scan chain formed by shift register latches arranged in the chain having a scan path with input pins and output pins, said failed scan chain having failed at least one previously run test, said program product comprising:

a computer readable medium having recorded thereon computer readable program code performing the method comprising:

executing a flush test for the scan chain under test;

recording flush test diagnostics for the flush test;

executing a scan test for the scan chain under test;

recording further test diagnostics in the event either or both the flush test or the scan test fails; and analyzing the recorded flush test diagnostics and further test diagnostics to identify a call to one or more probable failed or failing shift register latches in the tested scan chain.

22. The program product of claim 21 wherein said recording further test diagnostics of the method comprises recording disturb diagnostics for the scan chain under test.

23. The program product of claim 21 wherein said recording further test diagnostics of the method comprises recording deterministic diagnostics for the scan chain under test.

24. The program product of claim 21 wherein said recording further test diagnostics of the method comprises recording LBIST diagnostics for the scan chain under test.

25. The program product of claim 21 wherein said recording further test diagnostics of the method comprises recording ABIST diagnostics for the scan chain under test.

26. The program product of claim 21 wherein said recording further test diagnostics of the method comprises recording Look-Ahead diagnostics for the scan chain under test.

27. The program product of claim 21 wherein the scan chain being tested comprises a scan chain of general purpose test registers.

28. The program product of claim 21 wherein said method further comprises sequentially testing portions of said scan chain;

recording flush diagnostics and further diagnostics for each of said sequentially tested portion; and analyzing the diagnostics of said portions of said scan chain to further identify a call to failed or failing register latches in the tested scan chain.

29. The program product of claim 21 wherein said method further comprises testing said scan chain at different voltage levels to determine the sensitivity of said tested scan chain to differing voltage levels.

30. The program product of claim 21 wherein the electronic chip has multiple scan chains, and said method further comprises testing each of said multiple scan chain and logging the pins of failed or failing ones of said scan chains to identify calls to failed or failing register latches in the multiple scan chains being tested.

* * * * *